(12) United States Patent
Sharma (10) Patent No.: US 11,127,861 B2
(45) Date of Patent: Sep. 21, 2021

(54) MULTI-GATE THIN FILM TRANSISTOR MEMORY

(71) Applicant: Intel Corporation, Santa Clara, CA (US)

(72) Inventor: Abhishek A. Sharma, Hillsboro, OR (US)

(73) Assignee: Intel Corporation, Santa Clara (CA)

( * ) Notice: Subject to any disclaimer, the term of this patent is extended or adjusted under 35 U.S.C. 154(b) by 0 days.

(21) Appl. No.: 16/633,614

(22) PCT Filed: Sep. 27, 2017

(86) PCT No.: PCT/US2017/053592
§ 371 (c)(1),
(2) Date: Jan. 24, 2020

(87) PCT Pub. No.: WO2019/066791
PCT Pub. Date: Apr. 4, 2019

(65) Prior Publication Data
US 2021/0066509 A1 Mar. 4, 2021

(51) Int. Cl.
| | | |
|---|---|---|
| G11C 16/04 | (2006.01) |
| H01L 29/792 | (2006.01) |
| G11C 16/10 | (2006.01) |
| G11C 16/26 | (2006.01) |
| H01L 29/417 | (2006.01) |

(Continued)

(52) U.S. Cl.
CPC ...... *H01L 29/7923* (2013.01); *G11C 16/0466* (2013.01); *G11C 16/10* (2013.01); *G11C 16/26* (2013.01); *H01L 29/41733* (2013.01); *H01L 29/4908* (2013.01); *H01L 29/7869* (2013.01); *H01L 29/78648* (2013.01); *H01L 29/78663* (2013.01); *H01L 29/78672* (2013.01); *H01L 29/78681* (2013.01); *H01L 29/78684* (2013.01); *H01L 29/78693* (2013.01)

(58) Field of Classification Search
CPC ...... G11C 16/0466; G11C 16/10; G11C 16/26
See application file for complete search history.

(56) References Cited

U.S. PATENT DOCUMENTS

| | | | | |
|---|---|---|---|---|
| 7,951,678 B2 * | 5/2011 | Anderson | ........... | H01L 29/4966 438/275 |
| 8,391,059 B2 * | 3/2013 | Lu | ........................ | G11C 11/404 365/182 |

(Continued)

FOREIGN PATENT DOCUMENTS

| | | |
|---|---|---|
| EP | 1693898 B1 | 8/2006 |
| KR | 10-2016-0061982 A | 6/2016 |

OTHER PUBLICATIONS

International Search Report and Written Opinion, International Application No. PCT/US2017/053592, dated May 28, 2018, 13 pages.

(Continued)

*Primary Examiner* — Pho M Luu
(74) *Attorney, Agent, or Firm* — Trop, Pruner & Hu, P.C.

(57) ABSTRACT

An embodiment includes an apparatus comprising: a thin film transistor (TFT) comprising: source and drain contacts; first and second gate contacts: a semiconductor material, comprising a channel, between the first and second gate contacts; and a first dielectric layer, between the first and second gate contacts, to fix charged particles. Other embodiments are described herein.

25 Claims, 8 Drawing Sheets

(51) Int. Cl.
    *H01L 29/49*     (2006.01)
    *H01L 29/786*     (2006.01)

(56) References Cited

U.S. PATENT DOCUMENTS

| | | | |
|---|---|---|---|
| 9,659,963 B2* | 5/2017 | Cheng | ................ H01L 27/0688 |
| 2012/0061652 A1 | 3/2012 | Sugisawa et al. | |
| 2012/0175679 A1* | 7/2012 | Marino | ................ H01L 29/407 |
| | | | 257/194 |
| 2014/0291669 A1 | 10/2014 | Ji et al. | |
| 2015/0072498 A1 | 3/2015 | Dewey et al. | |

OTHER PUBLICATIONS

"Charge trap flash," Wikipedia, downloaded Sep. 12, 2017.
"eDRAM", Wikipedia, downloaded Sep. 12, 2017.
Tyson, "EPROM—How ROM Works", HowStuffWorks, downloaded Sep. 12, 2017.
"Flash Memory", Wikipedia, downloaded Sep. 12, 2017.
"Floating-gate MOSFET", Wikipedia, downloaded Sep. 12, 2017.
"Memory cell (binary)", Wikipedia, downloaded Sep. 12, 2017.
Ruzyllo, "Semiconductor OneSource: Semiconductor Glossary—Search for: tft", downloaded Sep. 12, 2017.
"Thin-film transistor", Wikipedia, downloaded Sep. 12, 2017.

* cited by examiner

MULTI-GATE THIN FILM TRANSISTOR MEMORY

TECHNICAL FIELD

Embodiments of the invention are in the field of semiconductor devices and, in particular, thin film transistors.

BACKGROUND

A thin film transistor (TFT) may include a field effect transistor implemented using thin film technology. The thin films may include films of polycrystalline or amorphous silicon (or other thin film semiconductors) and a variety of insulating substrates. More specifically, a TFT may include a special kind of metal-oxide-semiconductor field effect transistor (MOSFET) made by depositing thin films of an active semiconductor layer as well as metallic contacts over a supporting (but relatively low-conducting or non-conducting) substrate. TFTs differ from conventional MOSFETs because the semiconductor material (and channel) of conventional MOSFETs is typically the substrate, such as a silicon wafer (instead of a thin film as is the case with a TFT).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Applicant has determined several shortcomings are present with conventional TFT based memories.

Figure 1:
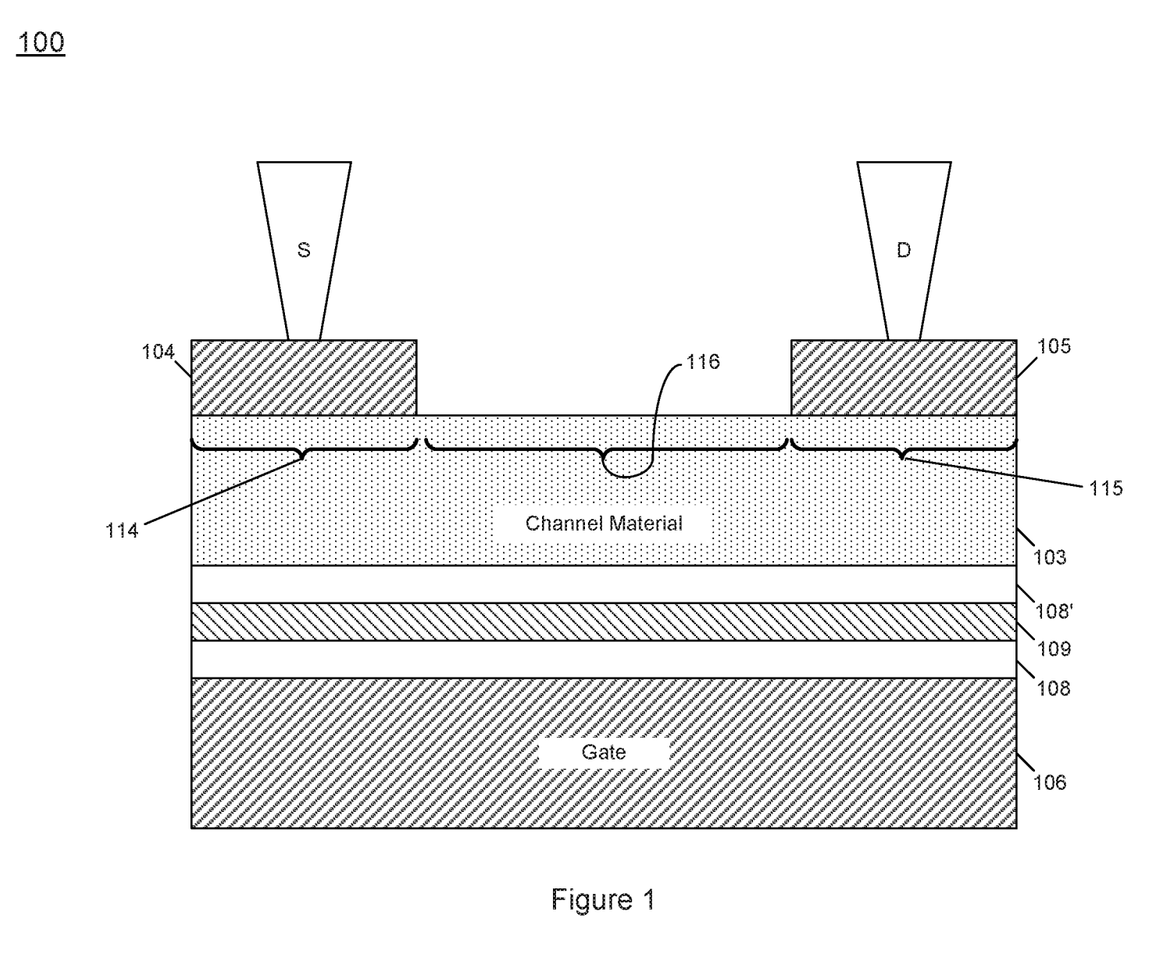
FIG. 1 includes a conventional TFT memory.

FIG. 1 includes a conventional TFT based memory 100 which includes a semiconductor material 103 comprising a channel. Source, drain, and gate contacts 104, 105, 106 are coupled to the channel layer 103. The gate contact 106 is separated from the channel by gate oxide 108 and an additional oxide 108' (which may be a tunnel oxide). A charge trap layer 109 is between oxides 108, 108'. The charge trap layer 109 may include a nitride layer between two oxide layers (ONO) (such as layers 108, 108').

Layer 109 may be programmed by biasing gate 106 to locate electrons or holes in layer 109 (using, for example, tunneling or hot carrier injection). The charge in layer 109 will then affect threshold voltage (Vt) for TFT based memory 100. Vt is the voltage applied to the gate of the TFT that is necessary to open a conductive channel between source and drain (i.e., voltage necessary for the inversion layer to be formed at the semiconductor surface near the gate). The gate 106 can manipulate area 114 (channel material directly below source contact 104) by applying a voltage across the source and gate. The gate 106 can manipulate area 115 (channel material directly below drain contact 105) by applying a voltage across the drain and gate. However, Applicant determined the gate 106 has difficulty manipulating area 116 (channel material directly between areas 114, 115) by applying a voltage across the source (or drain) and gate. Thus, area 116 is a form of "floating" channel. The difficulty affecting channel area 116 leads to increased Vt, which decreases power efficiency, decreases switching speed, and/or increases read time (due to low transconductance in area 116) for TFT 100. Further, this affects subthreshold swing (SS), which indicates the $V_{GS}$ required to increase $I_{DS}$ by one decade, as seen in the subthreshold region. A smaller SS is preferable in some embodiments because it can result in low power consumption and higher switching speed for the TFT.

Applicant further determined TFT 100 does not have the ability to simultaneously read and write. For example, to write a voltage may need to be applied to the source and gate $V_{SG}$ or applied to the drain and gate $V_{DG}$. However, to read current is passed through the source and drain based on $V_{SD}$. More specifically, once layer 109 is charged, the charge in layer 109 screens (partially cancels) the electric field from the gate 106, thus, increasing the threshold voltage ($V_{T1}$) of the cell. This means that now a higher voltage ($V_{T2}$) must be applied to the gate 106 to make the channel conductive. In order to read a value from the transistor, an intermediate voltage between the threshold voltages ($V_{T1}$ & $V_{T2}$) is applied to the gate 106. If the channel conducts at this intermediate voltage, the ONO layer 109 must be uncharged (if layer 109 was charged there be no conduction because the intermediate voltage is less than $V_{T2}$), and hence, a logical "1" is stored in the gate. If the channel does not conduct at the intermediate voltage, it indicates that the layer 109 is charged, and hence, a logical "0" is stored in the gate. The presence of a logical "0" or "1" is sensed by determining whether there is current flowing through the transistor when the intermediate voltage is asserted on the gate 106. In other words, the read and write paths utilize the same areas of TFT and therefore cannot be done simultaneously, which negatively affects read/write speeds.

Applicant further determined that undesirable charge trapping can occur immediately adjacent source and drain contacts 104, 105. This trapping may occur in material imperfections near the channel/contact boundary (e g., poor bonding between the channel/contact materials). Shielding due to layer 109 can negatively affect the ability of gate 106 to control the channel in areas 114, 115 (and offset undesired charge trapping immediately adjacent source and drain contacts 104, 105). This results in degraded subthreshold swing and an increased voltage budget of operation.

In addition, conventional technologies sometimes use an access transistor in addition to the TFT to help offset the poor control over area 116. For example, this may be done by adding a transistor in series with the memory transistor (e.g., TFT 100). The additional transistor makes the memory transistor immune (or less susceptible) to leakage of charge and poor subthreshold behavior. However, adding the additional transistor increases the overall footprint necessary to operate the TFT based memory and complicates manufacturing of the same.

However, an embodiment addresses the issues addressed above and provides improved electrostatic gate control of area 116 and a more reliable (and lower in many cases) Vt that may be well controlled using traditional metal gate workfunction (WF) tuning. Such an embodiment employs gates above and below the channel material as well as a "charge trap" layer below or above the channel layer to introduce a fixed charge that can set the channel potential and hence Vt of the device.

Figure 2:
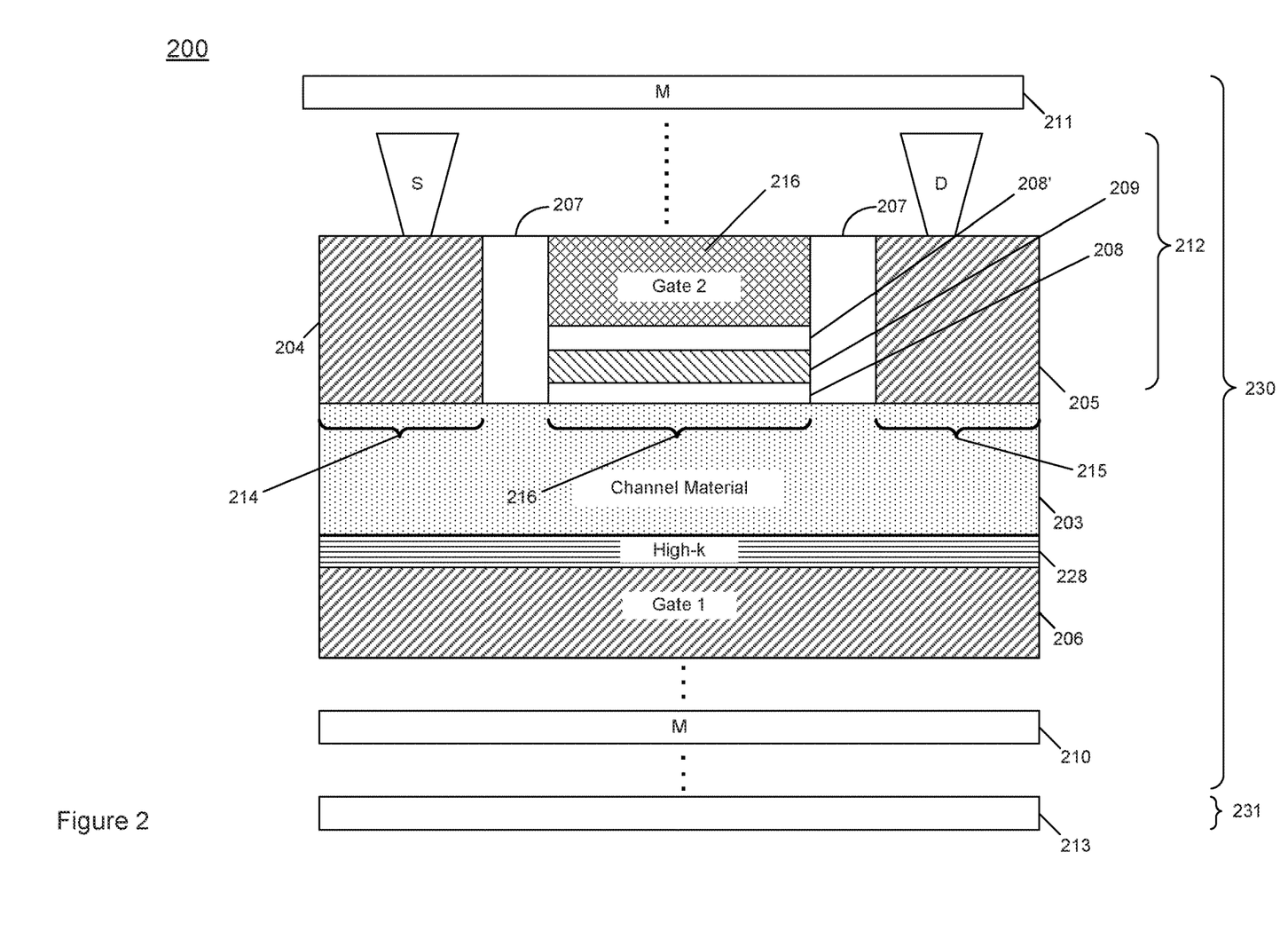
FIG. 2 includes a multi-gate TFT memory in an embodiment.

FIG. 2 includes an embodiment of a TFT based memory 200. Memory 200 includes first and second metal layers 210, 211. A TFT is between the first and second metal layers. The TFT comprises source and drain contacts 204, 205; first gate contact 206 and second gate contact 216; a semiconductor material 203, comprising a channel, between the first and second gate contacts. The TFT further includes a charge trap layer 209 between the first and second gate contacts. The charge trap layer includes an insulator material to fix charged particles.

As used herein, a carrier is a "free carrier" such as an electron in the conduction band and a hole in the valence band of semiconductor that is free to carry electric charge, and hence, can contribute to the semiconductor conductivity. Free carriers are included in channel material 203 (sometimes referred to herein as semiconductor material). In contrast, a mere "charge" is a fixed charge in an insulative material (e.g., relatively locked within the matrix of an insulative material) that is not free to carry electric charge. Such a fixed charge may include an oxide or nitride fixed charge. Layer 209 (the "charge trap" layer) includes such an insulative material that traps of fixes charges. For example, an oxide trapped or fixed charge includes charge centers in $SiO_2$ and other dielectrics which are electrically activated by trapping charge carriers injected into the oxide. The charge trap layer 209 may be formed using, for example, tunneling or hot carrier injection. A trap layer including positive ions will repel majority hole carriers driving majority hole carriers towards gate 206 and consequently more under the control of the field of gate 206 than is possible with conventional TFTs. A trap layer including negative ions will repel majority electron carriers driving majority electron carriers towards the gate 206 and consequently more under the control of the field of gate 206 than is possible with conventional TFTs.

In FIG. 2 the source and drain both correspond to channel 203 and at least one of the source and the drain is doped with mobile carriers (or such carriers may be present intrinsically) but the charge trap layer is not doped with mobile carriers. Instead, the charged particles of the trap layer 209 are fixed and generally do not comprise mobile carriers.

In the embodiment of FIG. 2 the charge trap layer includes a nitride (layer 209) and adjacent layers 208, 208' include an oxide. The nitride is to fix the charged particles. Thus, layer 208 constitutes a first dielectric layer directly contacting a first surface of the charge trap layer 209. Layer 208' constitutes a second dielectric layer directly contacting a second surface of the charge trap layer 209.

Dielectric spacers 207 are between the source and drain contacts and gate 216.

In the embodiment of FIG. 2 the channel 203 is between the first gate contact 206 and the drain contact 205. The charge trap layer 208 is between the channel 203 and the second gate contact 216. An additional dielectric layer 228 is between the first gate contact 206 and the channel 203. The purpose of layer 228 is to provide additional gate control to control the channel 203 and to enable an independent read operation for TFT 200. In an embodiment the additional dielectric layer 228 directly contacts the semiconductor material 203.

In an embodiment the source and drain contacts 204, 205 are included in a metal layer. Thus, embodiments address situations where TFTs are included in metal (M) layers of the "backend" of the device.

Regarding the "backend", once semiconductor wafers are prepared, a large number of process steps are still necessary to produce desired semiconductor integrated circuits. In general the steps can be grouped into four areas: Frontend Processing, Backend Processing, Test, and Packaging. Frontend and backend processing are pertinent to embodiments and are therefore described below.

Frontend processing refers to the initial steps in device fabrication. In this stage semiconductor devices (e.g., transistors) are created. A typical front end (also referred to herein as "frontend") process includes: preparation of the wafer surface (e.g., fin formation for a finFET) (see element 213 of FIG. 2), patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" (BEOL) of the back end (also referred to herein as "backend") involves depositing various layers of metal (sometimes referred to herein as M layers (see layers 210, 212, 211 of FIG. 2) used to form traces, bit lines, word lines, and the like) and insulating material (sometimes referred to herein as V layers because such layers often include vias) in the desired pattern. Typically the metal layers consist of aluminum, copper, and the like. The insulating material may include SiO2, low-K materials, and the like. The various metal layers are interconnected by etching holes, called "vias", in the insulating material and depositing metal (e.g., Tungsten) in them. Thus, a backend portion may include, for example, 12 metal layers: a bottom metal layer (M0), a top metal layer (M11), and a plurality of metal layers (M1, M2, M3, M4, M5, M6, M7, M8, M9, and/or M10) between the bottom and top metal layers. The "bottom metal layer" is so named because the backend portion includes no metal layer between the bottom metal layer and a top of the frontend portion. The "top metal layer" is so named because the backend portion includes no metal layer between the top metal layer and the top of the backend portion. Having 12 metal layers is just an example and backend portions may include more (e.g., 14, 16, 18, 20 or more) or less (e.g., 4, 6, 8) metal layers.

Thus, in FIG. 2 layer 210 may be any M layer, layer 212 may be any M layer, and layer 211 may be any M layer. Further, TNT 200 comprises a substrate 213, wherein (a) the M layers 210, 211, 212 are each included in a backend portion 230 of the apparatus, and (b) a frontend portion 231 of the apparatus is located between a portion of the substrate 213 and the backend portion.

In the embodiment of FIG. 2 each of the first and second gate contacts are coupled to at least one power source to bias the first and second gate contacts independently of one another. For example, during a write operation gate 216 may be biased while gate 206 is left unbiased and not used. However, during a read operation gate 206 is used and, in some embodiments, gate 216 is also biased during a read. Thus, in an embodiment the first gate electrode 206 is configured to conduct read operations for the TNT but not write operations for the TNT. In contrast to the conventional technologies, such as FIG. 1, which rely on a single path to conduct both read and write operations, the embodiment of FIG. 2 provides independent paths whereby a gate 206 could be used for a read operation while simultaneously gate 216 is used for a write operation.

Figure 3:
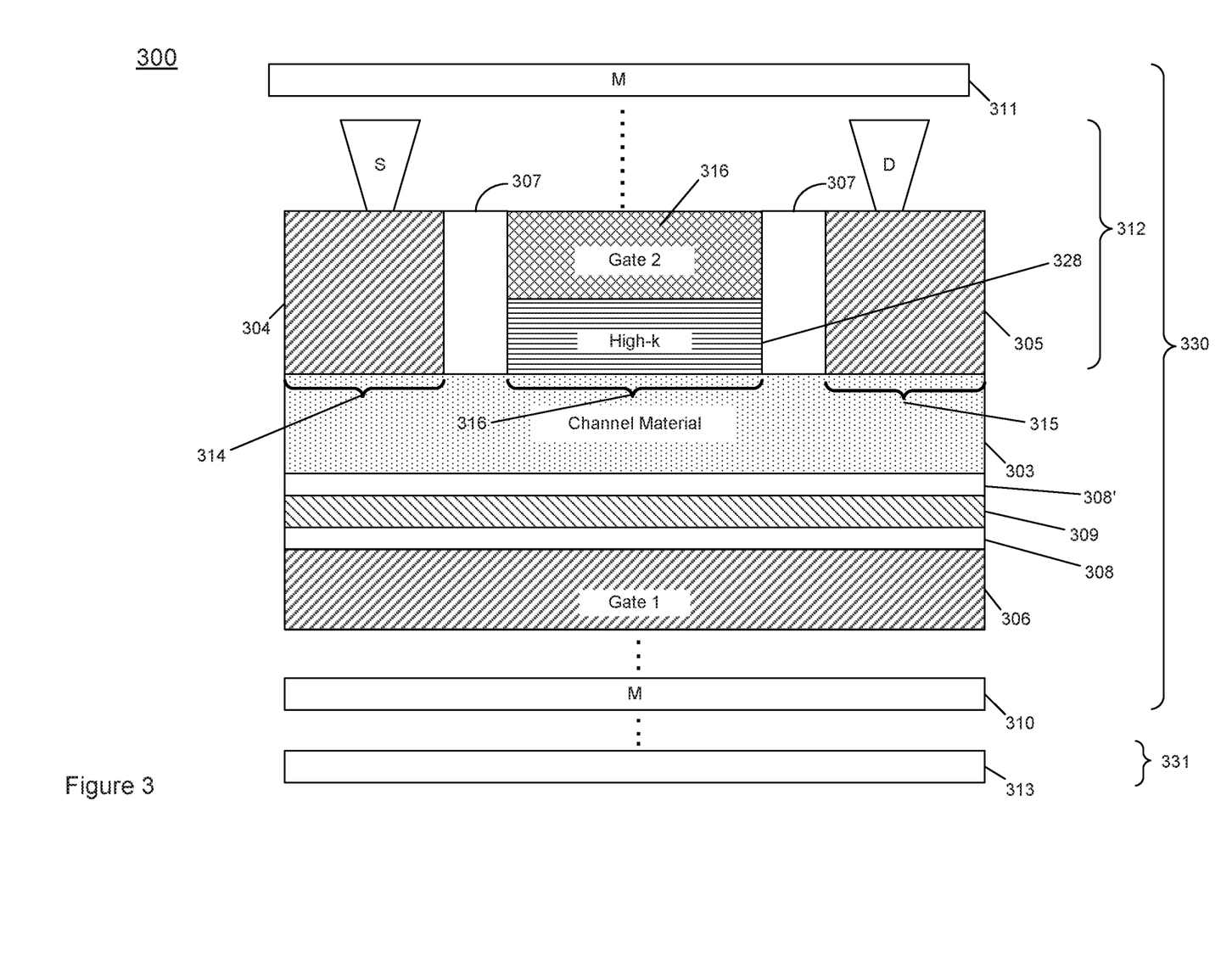
FIG. 3 includes a multi-gate TFT memory in an embodiment.

FIG. 3 includes an embodiment of a TFT based memory 300. Memory 300 includes first and second metal layers 310, 311. A TFT is between the first and second metal layers. The TFT comprises source and drain contacts 304, 305; first gate contact 306 and second gate contact 316; a semiconductor material 303, comprising a channel, between the first and second gate contacts. The TFT further includes a charge trap layer 309 between the first and second gate contacts and between oxide layers 308, 308'. The charge trap layer includes an insulator material (e.g., nitride) to fix charged particles. The charge trap layer 309 may be formed using, for example, tunneling or hot carrier injection.

In FIG. 3 the source and a drain both correspond to channel 303 and at least one of the source and the drain is doped with mobile carriers (or such carriers may be present intrinsically) but the charge trap layer is not doped (generally speaking) with mobile carriers. Instead, the charged particles of the trap layer 309 are fixed and generally do not comprise mobile carriers.

In the embodiment of FIG. 3 the channel 303 is between the first gate contact 306 and the drain contact 305. The charge trap layer 309 is between the channel 303 and the first gate contact 306. An additional dielectric layer 328 is between the second gate contact 316 and the channel 303. The purpose of layer 328 (gate dielectric) is to provide additional gate control to control the channel 303 and to enable an independent read operation for TNT 300. In an embodiment the additional dielectric layer 328 directly contacts the semiconductor material 303.

Similar to FIG. 2, TFT 300 of FIG. 3 includes M layer 310, 311, 312 substrate 313, dielectric spacers 307, frontend 331, backend 330. Further, while portions 214, 314 and 215, 315 are still adequately within fields generated by gates 206, 306, in the embodiments of FIGS. 2 and 3 channel portions 216, 316 are adequately accessed by fields from gate 216, 316. As a result Vt is lowered due to the increased field presence in portions 216, 316. Further, the increased field presence in portions 216, 316 boosts write fields and erase fields for TFTs 200, 300. There is an increased sense margin and ON/OFF ratio (i.e., better detectability of different memory states when used as a memory system) for the embodiments of FIGS. 2 and 3. Also, this removes or lessens the need for an extra transistor (e.g., a transistor in series with TNT 200, 300) to operate a memory cell including TFT 200, 300.

Figure 4:
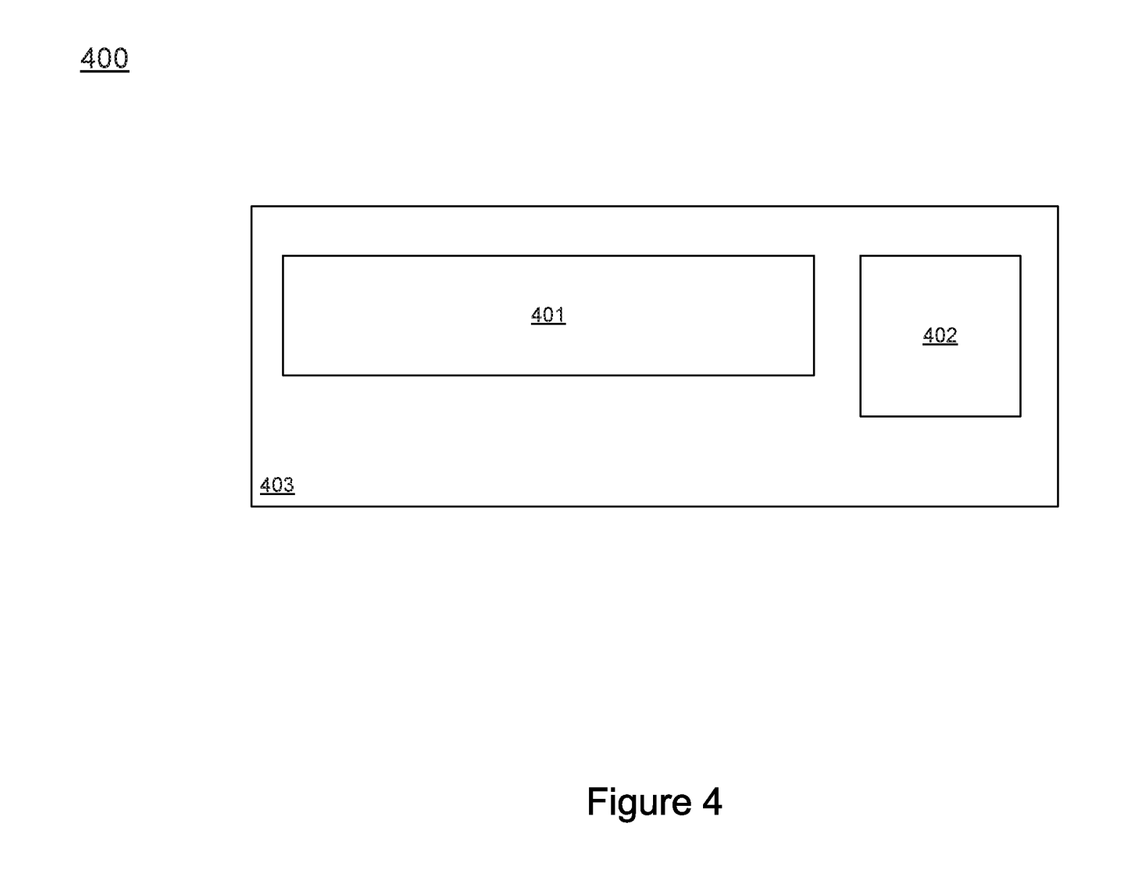
FIG. 4 includes a semiconductor package including a multi-gate TFT memory in an embodiment.

FIG. 4 includes a single package 400 that includes a first die 401 (which may include at least one of a processor and an application specific integrated circuit (ASIC)), a second die (which may include embedded dynamic random access memory (e-DRAM) 402, which includes a memory cell that includes either or both of TFTs 200, 300), and substrate 403 that supports dies 401, 402. The memory cell may include a single capacitor and a single TFT, such as TFT 200 or 300. However, in other embodiments modules such as a first module (which may include at least one of a processor and an ASIC) and a second module (which may include e-DRAM comprising a memory cell that includes TFT 200 and/or TFT 300) both on a single die.

Figure 8:
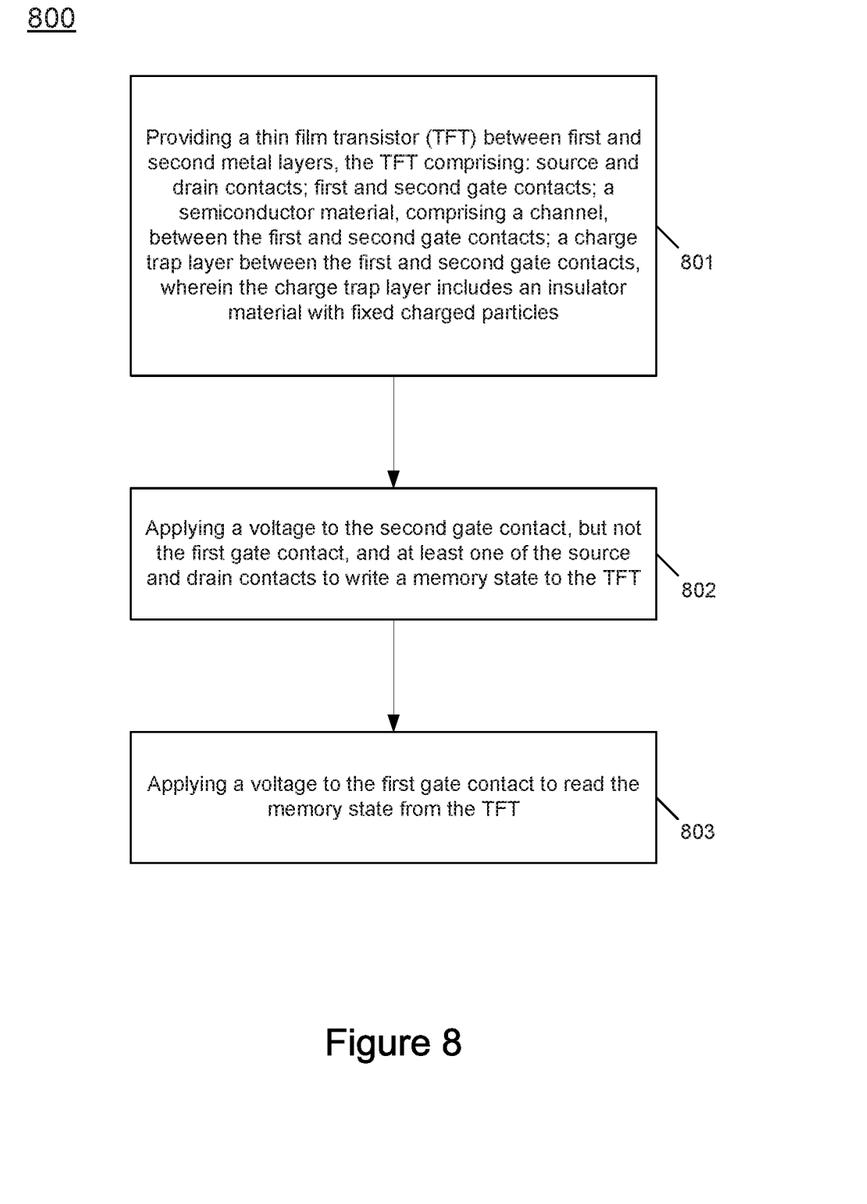
FIG. 8 includes a method of forming a multi-gate TFT memory in an embodiment.

FIG. 8 includes a method 800 comprising (block 801) providing a thin film transistor (TFT) between the first and second metal layers, the TFT comprising: source and drain contacts; first and second gate contacts; a semiconductor material, comprising a channel, between the first and second gate contacts; a charge trap layer between the first and second gate contacts, wherein the charge trap layer includes an insulator material with fixed charged particles. Block 802 includes applying a voltage to the second gate contact, but not the first gate contact, and at least one of the source and drain contacts to write a memory state to the TFT. Block 803 includes applying a voltage to the first gate contact to read the memory state from the TFT.

An embodiment includes an apparatus comprising: a TFT comprising: source and drain contacts; first and second gate contacts; a semiconductor material, comprising a channel, between the first and second gate contacts; a first dielectric layer, between the first and second gate contacts, to fix charged particles. Thus, not all embodiments require a TFT that is included in a BEOL area of a system.

In various embodiments, the substrate for the TFT 200 includes ILD, glass, etchstop (e.g., silicon nitride), silicon with several layers of ILD (e.g., SiO2, SiN, HfO2, Al2O3, SiOC), and the like. Thus, TFT 200 constitutes a TFT because, for example, its channel layer is deposited as a thin film (rather than have a channel be a part of a substrate, such as a silicon wafer used for MOSFET channels).

The trap layer may include silicon nitride, hafnium oxide, silicon oxide, silicon oxynitride, aluminum oxynitride, aluminum nitride, aluminum oxide, silicon carbide, and titanium oxide.

The channel layer may include zinc oxide, indium oxide, gallium oxide, indium gallium oxide, amorphous silicon, amorphous germanium, amorphous silicon germanium, polysilicon, polygermanium, poly germanium doped with boron, poly germanium doped with aluminum, poly germanium doped with phosphorous, poly germanium doped with arsenic, amorphous III-V materials, poly III-V materials, tin oxide, cupric oxide (CuO), cuprous oxide (Cu$_2$O), indium gallium zinc oxide (IGZO), IGZO with ratios 1:1:1 of each oxide, indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, poly-III-V (e.g., InAs, InGaAs, InP, amorphous InGaZnO (a-IGZO)), crystal (e.g., InGaZnO, (c-IGZO), GaZnON, ZnON), C-Axis Aligned Crystal (CAAC) (e.g., InGaZnO), and the like.

Many embodiments addressed herein have utilized TFTs in memory. However, other applications for TFT embodiments discussed herein include, for example, double gated transistors where one gate serves as an access gate and the other gate acts as a passivation gate (which maintains a pre-set channel potential by the application of a constant voltage).

Further, embodiments that are used as memories may include more than 1 bit for storage. For example, the charge trapping layer 209 may store a first a bit on the left side (see FIG. 2) of layer 209 and another bit on the right side of layer 209 and operate in a manner similar to Charge Trap Flash (CTF) semiconductor memories (e.g., can be read by running a current through the channel in different directions).

Various embodiments include a semiconductive substrate (e.g., element 213). Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

Figure 5:
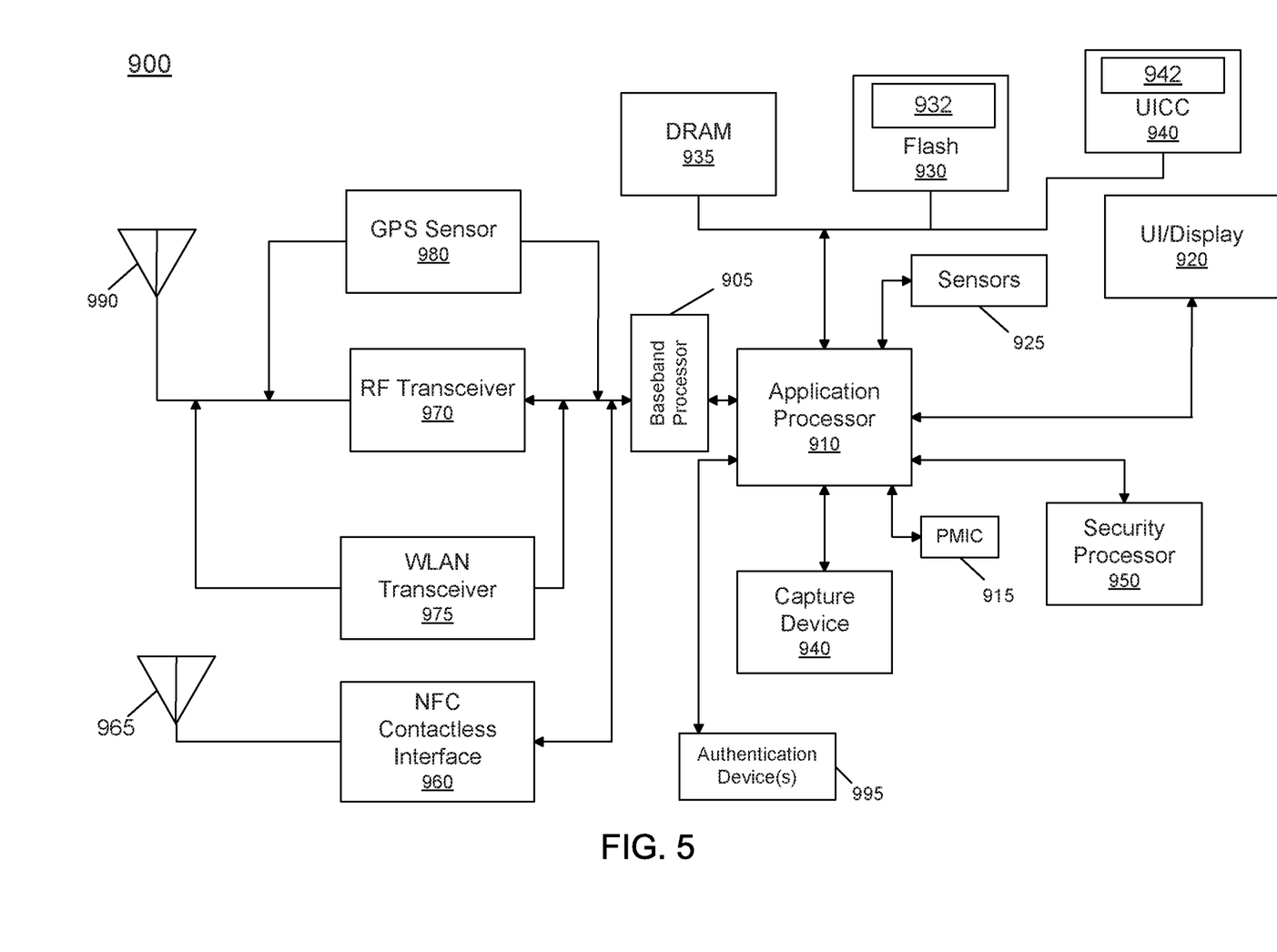
FIGS. 5, 6, 7 include systems that include TFTs described herein.

Referring now to FIG. 5, shown is a block diagram of an example system with which embodiments can be used. As seen, system 900 may be a smartphone or other wireless communicator or any Internet of Things (IoT) device. A baseband processor 905 is configured to perform various signal processing with regard to communication signals to be transmitted from or received by the system. In turn, baseband processor 905 is coupled to an application processor 910, which may be a main CPU of the system to execute an OS and other system software, in addition to user applications such as many well-known social media and multimedia apps. Application processor 910 (which may be included in the package of FIG. 4) may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 (which may include memory cells with TFTs such as those described in FIGS. 2, 3 and/or 4) and a system memory, namely a DRAM 935 (which may include memory cells such as those described in FIGS. 2, 3 and/or 4). In some embodiments, flash memory 930 may include a secure portion 932 (which may include memory cells such as those described in FIGS. 2, 3, and/or 4) in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 (which may include memory cells such as those described in FIGS. 2, 3, and/or 4) to store secure user information. System 900 may further include a security processor 950 (e.g., Trusted Platform Module (TPM)) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitries may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 6:
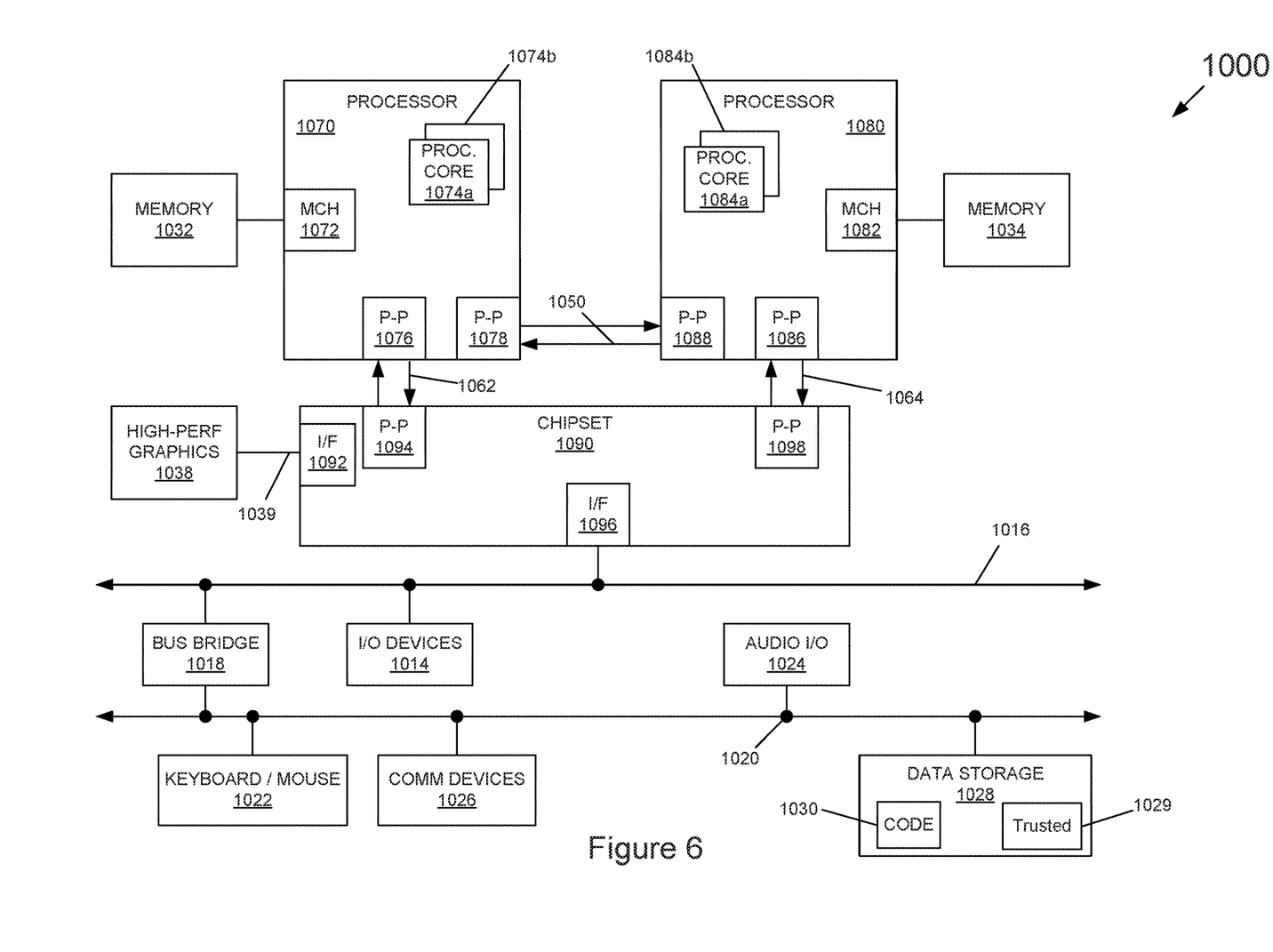

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors such as SoCs (which may be included in packages such as the package of FIG. 4), including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors. These memories may include memory cells with TFTs such as those described in FIGS. 2, 3, and/or 4. First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device (which may include memory cells with TFTs such as those described in FIGS. 2, 3, and/or 4). As seen, data storage unit 1028 may include code 1030, in one embodiment. As further seen, data storage unit 1028 also includes a trusted storage 1029 (which may include memory cells with TFTs such as those described in FIGS. 2, 3, and/or 4) to store sensitive information to be protected. Further, an audio I/O 1024 may be coupled to second bus 1020.

Figure 7:
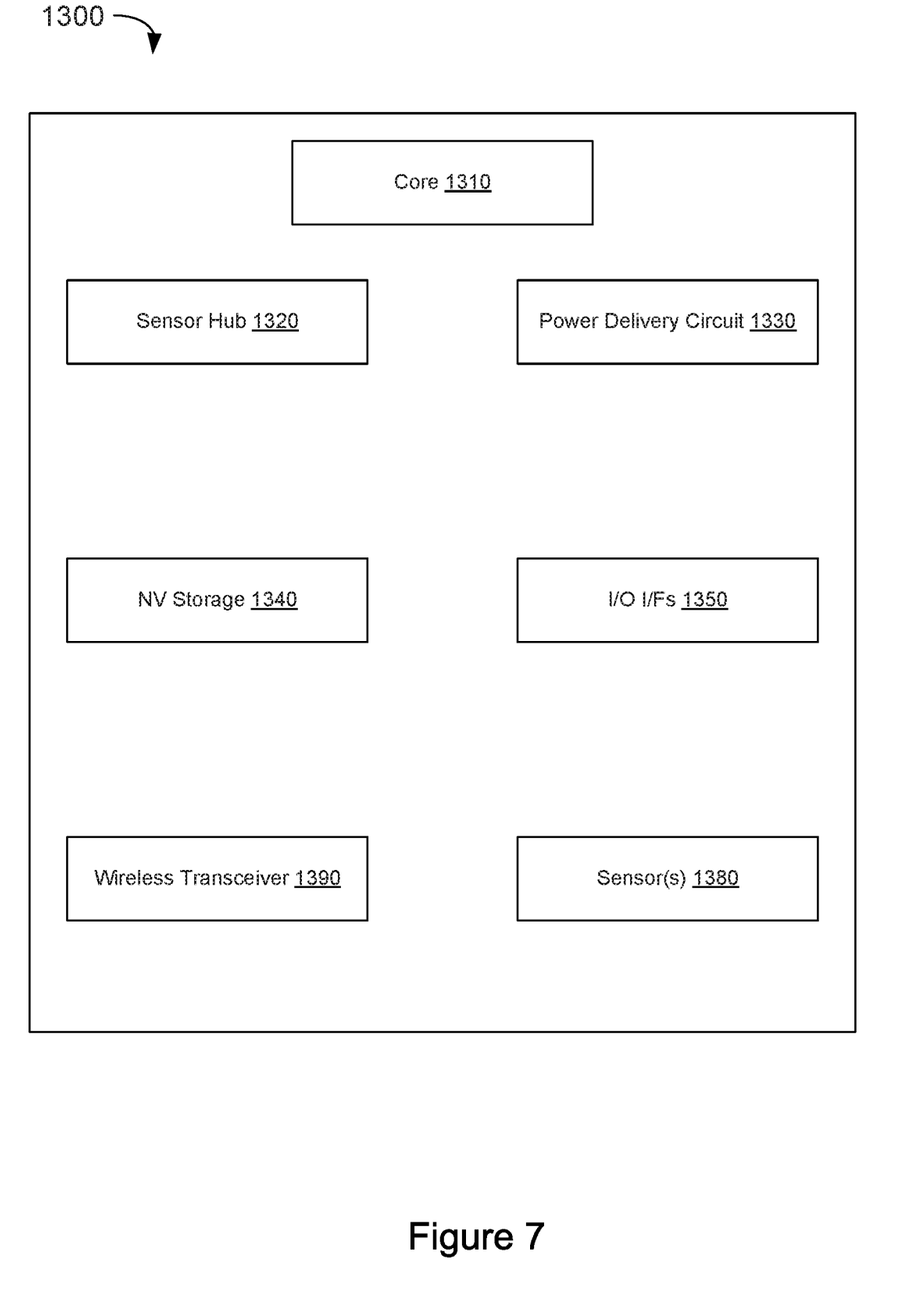

Embodiments may be used in environments where IoT devices may include wearable devices or other small form factor IoT devices. Referring now to FIG. 7, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (of course in other embodiments more than one core may be present). Such core (which may be included in a package similar to FIG. 4) may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340 (which may include memory cells with TFTs such as those described in FIGS. 2, 3, and/or 4). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1 includes an apparatus comprising: first and second metal layers; a thin film transistor (TFT) between the first and second metal layers, the TFT comprising: source and drain contacts; first and second gate contacts; a semiconductor material, comprising a channel, between the first and second gate contacts; a charge trap layer between the first and second gate contacts, wherein the charge trap layer includes an insulator material to fix charged particles.

As mentioned above, a TFT has layers formed as thin layers. For example, the channel layer is not formed from a silicon substrate the way a MOSFET may be formed. By "thin" the following layers have heights such as: channel layer (height between 5-40 nm), gate dielectric layer such as layer 228 (height between 5-20 nm), charge trap layer (height between 2-20 nm), source/drain contacts (height between 5-40 nm).

Example 2 includes the apparatus of example 1 wherein: the charge trap layer includes a nitride and an oxide; the nitride is to fix the charged particles.

Example 3 includes the apparatus of example 2 comprising: a first dielectric layer directly contacting a first surface of the charge trap layer; a second dielectric layer directly contacting a second surface of the charge trap layer; wherein the first and second surfaces are on opposing sides of the charge trap layer.

Example 4 includes the apparatus of example 2 wherein the channel is between the first gate contact and the drain contact.

Example 5 includes the apparatus of example 2 wherein the charge trap layer is between the channel and the second gate contact.

Example 6 includes the apparatus of example 5 comprising an additional dielectric layer between the first gate and the channel.

Example 7 includes the apparatus of example 6 wherein the additional dielectric layer directly contacts the semiconductor material.

Example 8 includes the apparatus of example 2 wherein the charge trap layer is between the channel and the first gate contact.

Example 9 includes the apparatus of example 8 comprising an additional dielectric layer between the second gate and the channel.

Example 10 includes the apparatus of example 9 wherein the additional dielectric layer directly contacts the semiconductor material.

Example 11 includes the apparatus of example 2 wherein the source and drain contacts are included in the second metal layer.

For example, the source and drain contacts 204, 205 may be "between" M layers 210, 211. However, source and drain contacts 204, 205 may also be said to be "between" M layers 210, 212 (even though they are at least partially in M layer 212).

Example 12 includes the apparatus of example 2 comprising a source and a drain both corresponding to the channel, wherein at least one of the source and the drain is doped with mobile carriers but the charge trap layer is not doped with mobile carriers.

Example 13 includes the apparatus of example 12 wherein the charged particles are fixed and do not comprise mobile carriers.

Example 14 includes the apparatus of example 1 comprising a substrate, wherein (a) the first and second metal layers are each included in a backend portion of the apparatus, and (b) a frontend portion of the apparatus is located between a portion of the substrate and the backend portion.

Example 15 includes the apparatus of example 1 comprising: at least one of a processor and an application specific integrated circuit (ASIC); a memory cell that includes the TFT; and a single package including the memory cell and the at least one of the processor and the ASIC.

Example 16 includes the apparatus of example 15 comprising a die, wherein the memory cell and the at least one of the processor and the ASIC are both included on the die.

Example 17 includes the apparatus of example 1 wherein each of the first and second gate contacts are coupled to at least one power source to bias the first and second gate contacts independently of one another.

Example 18 includes the apparatus of example 1 wherein the first gate electrode is configured to conduct read operations for the TNT but not write operations for the TNT.

Example 19 includes a system comprising: a memory; and a processor coupled to the memory, wherein at least one of the processor and the memory include a TFT according to any one of examples 1 to 18.

Example 20 includes a method comprising: providing a thin film transistor (TFT) between the first and second metal layers, the TFT comprising: source and drain contacts; first and second gate contacts; a semiconductor material, comprising a channel, between the first and second gate contacts; a charge trap layer between the first and second gate contacts, wherein the charge trap layer includes an insulator material with fixed charged particles; applying a voltage to the second gate contact, but not the first gate contact, and at least one of the source and drain contacts to write a memory state to the TFT; applying a voltage to the first gate contact to read the memory state from the TFT.

Example 21 includes the method of example 20 comprising fixing the charge particles within a nitride included in the charge trap layer.

Example 22 includes an apparatus comprising: a thin film transistor (TFT) comprising: source and drain contacts; first and second gate contacts; a semiconductor material, comprising a channel, between the first and second gate contacts; a first dielectric layer, between the first and second gate contacts, to fix charged particles.

Example 23 includes the apparatus of example 22 wherein: the first dielectric layer includes a nitride and an oxide; the nitride is to fix the charged particles.

Example 24 includes the apparatus of example 22 comprising: a second dielectric layer directly contacting a first surface of the first dielectric layer; a third dielectric layer directly contacting a second surface of the first dielectric layer; wherein the first and second surfaces are on opposing sides of the first dielectric layer.

Example 25 includes the apparatus of example 24 comprising: a fourth dielectric layer between the channel and one of the first and second gates; wherein first dielectric layer is between the channel and another of the first and second gates.

Example 1a includes an apparatus comprising: first and second metal layers; a thin film transistor (TFT) between the first and second metal layers, the TFT comprising: source and drain contacts; first and second gate contacts; a semiconductor material, comprising a channel, between the first and second gate contacts; an additional layer, between the first and second gate contacts, which includes an insulator material to fix charged particles.

Example 2a includes the apparatus of example 1a wherein the additional layer includes a charge trap layer comprising: (a) an oxide, and (b) a nitride to fix the charged particles.

Example 3a includes the apparatus of example 2a comprising: a first dielectric layer directly contacting a first surface of the charge trap layer; a second dielectric layer directly contacting a second surface of the charge trap layer; wherein the first and second surfaces are on opposing sides of the charge trap layer.

Example 4a includes the apparatus of example 2a wherein the channel is between the first gate contact and the drain contact.

Example 5a includes the apparatus of example 2a wherein the charge trap layer is between the channel and the second gate contact.

Example 6a includes the apparatus of example 5a comprising an additional dielectric layer between the first gate contact and the channel.

Example 7a includes the apparatus of example 6a wherein the additional dielectric layer directly contacts the semiconductor material.

Example 8a includes the apparatus of example 2a wherein the charge trap layer is between the channel and the first gate contact.

Example 9a includes the apparatus of example 8a comprising an additional dielectric layer between the second gate contact and the channel.

Example 10a includes the apparatus of example 9a wherein the additional dielectric layer directly contacts the semiconductor material.

Example 11a includes the apparatus of example 2a wherein the source and drain contacts are included in the second metal layer.

Example 12a includes the apparatus of example 2a comprising a source and a drain both corresponding to the channel, wherein at least one of the source and the drain is doped with mobile carriers but the charge trap layer is substantially not doped with mobile carriers.

Example 13a includes the apparatus of example 12a wherein: the charged particles are fixed and do not comprise mobile carriers; the charge trap layer includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof; the semiconductor material includes a member selected from the group consisting of zinc oxide, indium oxide, gallium oxide, indium gallium oxide, amorphous silicon, amorphous germanium, amorphous silicon germanium, polysilicon, polygermanium, polygermanium doped with boron, polygermanium doped with aluminum, polygermanium doped with phosphorous, polygermanium doped with arsenic, amorphous III-V materials, poly III-V materials, tin oxide, cupric oxide (CuO), cuprous oxide (Cu2O), indium gallium zinc oxide (IGZO), indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, InAs, InGaAs, InP, amorphous InGaZnO (a-IGZO), crystalline InGaZnO, GaZnON, ZnON, c-Axis Aligned Crystal (CAAC) (e.g., InGaZnO), or combinations thereof.

Example 14a includes the apparatus of example 1a comprising a substrate, wherein (a) the first and second metal layers are each included in a backend portion of the apparatus, and (b) a frontend portion of the apparatus is located between a portion of the substrate and the backend portion.

Example 15a includes the apparatus of example 1a comprising: at least one of a processor and an application specific integrated circuit (ASIC); a memory cell that includes the TFT; and a single package including the memory cell and the at least one of the processor and the ASIC.

Example 16a includes the apparatus of example 15a comprising a die, wherein the memory cell and the at least one of the processor and the ASIC are both included on the die.

Example 17a includes the apparatus of example 1a wherein each of the first and second gate contacts are to couple to at least one power source to bias the first and second gate contacts independently of one another.

Example 18a includes the apparatus of example 1a wherein the first gate contact is to conduct read operations for the TNT but not write operations for the TNT.

Example 19a includes a system comprising: a memory; and a processor coupled to the memory, wherein at least one of the processor and the memory include a TFT according to any one of examples 1a to 18a.

Example 20a includes a method comprising: providing a thin film transistor (TFT) between the first and second metal layers, the TFT comprising: source and drain contacts; first and second gate contacts; a semiconductor material, comprising a channel, between the first and second gate contacts; a charge trap layer between the first and second gate contacts, wherein the charge trap layer includes an insulator material with fixed charged particles; simultaneously (a) applying a voltage to the second gate contact, but not the first gate contact, and at least one of the source and drain contacts to write a memory state to the TFT, and (b) applying a voltage to the first gate contact to read the memory state from the TFT.

Example 21a includes the method of example 20a comprising fixing the charge particles within a nitride included in the charge trap layer.

Example 22a includes an apparatus comprising: a thin film transistor (TFT) comprising: source and drain contacts; first and second gate contacts; a semiconductor material, comprising a channel, between the first and second gate contacts; a first dielectric layer, between the first and second gate contacts, to fix charged particles.

Example 23a includes the apparatus of example 22a wherein the first dielectric layer includes (a) an oxide, and (b) a nitride to fix the charged particles.

Example 24a includes the apparatus of example 22a comprising: a second dielectric layer directly contacting a first surface of the first dielectric layer; a third dielectric layer directly contacting a second surface of the first dielectric layer; wherein the first and second surfaces are on opposing sides of the first dielectric layer.

Example 25a includes the apparatus of example 24a comprising: an fourth dielectric layer between the channel and one of the first and second gate contacts; wherein first dielectric layer is between the channel and another of the first and second gate contacts.

Example 26a includes the apparatus according to any one of examples 1a to 2a, 4a, 5a, 8a, 11a, 12a, and 14a to 18a comprising: a first dielectric layer directly contacting a first surface of the charge trap layer; a second dielectric layer directly contacting a second surface of the charge trap layer; wherein the first and second surfaces are on opposing sides of the charge trap layer.

Example 27a includes the apparatus according to any one of examples 1a to 3a, 5a, 8a, 11a, 12a, and 14a to 18a wherein the channel is between the first gate contact and the drain contact.

Example 28a includes the apparatus according to any one of examples 1a to 4a, 11a, 12a, and 14a to 18a wherein the charge trap layer is between the channel and the second gate contact.

Example 29a includes the apparatus according to any one of examples 1a to 5a, 8a, and 14a to 18a comprising a source and a drain both corresponding to the channel, wherein at least one of the source and the drain is doped with mobile carriers but the charge trap layer is substantially not doped with mobile carriers.

Example 30a includes the apparatus according to any one of examples 1a to 12a and 14a to 18a wherein: the charged particles are fixed and do not comprise mobile carriers; the charge trap layer includes a least one member selected from the group consisting of silicon nitride, hafnium oxide, silicon oxide, silicon oxynitride, aluminum oxynitride, aluminum nitride, aluminum oxide, silicon carbide, titanium oxide, or combinations thereof; the semiconductor material includes a member selected from the group consisting of zinc oxide, indium oxide, gallium oxide, indium gallium oxide, amorphous silicon, amorphous germanium, amorphous silicon germanium, polysilicon, polygermanium, polygermanium doped with boron, polygermanium doped with aluminum, polygermanium doped with phosphorous, polygermanium doped with arsenic, amorphous III-V materials, poly III-V materials, tin oxide, cupric oxide (CuO), cuprous oxide (Cu2O), indium gallium zinc oxide (IGZO), indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, InAs, InGaAs, InP, amorphous InGaZnO (a-IGZO), crystalline InGaZnO, GaZnON, ZnON, c-Axis Aligned Crystal (CAAC) (e.g., InGaZnO), or combinations thereof.

Example 31a includes the apparatus according to any one of examples 1a to 13a and 15a to 18a comprising a substrate, wherein (a) the first and second metal layers are each included in a backend portion of the apparatus, and (b) a frontend portion of the apparatus is located between a portion of the substrate and the backend portion.

Example 32a includes the apparatus according to any one of examples 1a to 14a and 16a to 18a comprising: at least one of a processor and an application specific integrated circuit (ASIC); a memory cell that includes the TFT; and a single package including the memory cell and the at least one of the processor and the ASIC.

Example 33a includes the apparatus according to any one of examples 1a to 16a and 18a wherein each of the first and second gate contacts are to couple to at least one power source to bias the first and second gate contacts independently of one another.

Example 34a includes the apparatus according to any one of examples 1a to 17a wherein the first gate contact is to conduct read operations for the TNT but not write operations for the TNT.

Example 35a includes an apparatus comprising: first and second metal layers; a thin film transistor (TFT) between the first and second metal layers, the TFT comprising: source and drain contacts; first and second gate contacts; a semiconductor material, comprising a channel, between the first and second gate contacts; an additional layer, between the first and second gate contacts, comprising a means for fixing charged particles.

Example 36a includes the apparatus of example 35a comprising a means for simultaneously conducting read and write operations for the TFT.

Example 37a includes an apparatus comprising: a thin film transistor (TFT) comprising: source and drain contacts; first and second gate contacts; a semiconductor material, comprising a channel, between the first and second gate contacts; a first layer, between the first and second gate contacts, comprising a means for fixing charged particles.

Example 38a includes the apparatus of example 37a comprising a means for simultaneously conducting read and write operations for the TFT.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   first and second metal layers;
   a thin film transistor (TFT) between the first and second metal layers, the TFT comprising:
      source and drain contacts;
      first and second gate contacts;
      a semiconductor material, comprising a channel, between the first and second gate contacts;
      an additional layer, between the first and second gate contacts, which includes an insulator material to fix charged particles.

2. The apparatus of claim 1 wherein the additional layer includes a charge trap layer comprising: (a) an oxide, and (b) a nitride to fix the charged particles.

3. The apparatus of claim 2 comprising:
   a first dielectric layer directly contacting a first surface of the charge trap layer;
   a second dielectric layer directly contacting a second surface of the charge trap layer;
   wherein the first and second surfaces are on opposing sides of the charge trap layer.

4. The apparatus of claim 2 wherein the channel is between the first gate contact and the drain contact.

5. The apparatus of claim 2 wherein the charge trap layer is between the channel and the second gate contact.

6. The apparatus of claim 5 comprising an additional dielectric layer between the first gate contact and the channel.

7. The apparatus of claim 6 wherein the additional dielectric layer directly contacts the semiconductor material.

8. The apparatus of claim 2 wherein the charge trap layer is between the channel and the first gate contact.

9. The apparatus of claim 8 comprising an additional dielectric layer between the second gate contact and the channel.

10. The apparatus of claim 9 wherein the additional dielectric layer directly contacts the semiconductor material.

11. The apparatus of claim 2 wherein the source and drain contacts are included in the second metal layer.

12. The apparatus of claim 2 comprising a source and a drain both corresponding to the channel, wherein at least one of the source and the drain is doped with mobile carriers but the charge trap layer is substantially not doped with mobile carriers.

13. The apparatus of claim 12 wherein:
   the charged particles are fixed and do not comprise mobile carriers;
   the charge trap layer includes a least one of silicon nitride, hafnium oxide, silicon oxide, silicon oxynitride, aluminum oxynitride, aluminum nitride, aluminum oxide, silicon carbide, titanium oxide, or combinations thereof;
   the semiconductor material includes at least one of zinc oxide, indium oxide, gallium oxide, indium gallium oxide, amorphous silicon, amorphous germanium, amorphous silicon germanium, polysilicon, polygermanium, polygermanium doped with boron, polygermanium doped with aluminum, polygermanium doped with phosphorous, polygermanium doped with arsenic, amorphous III-V materials, poly III-V materials, tin oxide, cupric oxide (CuO), cuprous oxide ($Cu_2O$), indium gallium zinc oxide (IGZO), indium gallium zinc (IGZ), crystalline IGZO, amorphous IGZ, nanocrystalline IGZ, tungsten antimonide, indium antimonide, nickel oxide, cobalt oxide, indium tin oxide, tungsten disulphide, molybdenum disulphide, molybdenum selenide, black phosphorus, graphene, graphyne, borophene, germanene, silicene, Si2BN, stanene, phosphorene, molybdenite, InAs, InGaAs, InP, amorphous InGaZnO (a-IGZO), crystalline InGaZnO, GaZnON, ZnON, c-Axis Aligned Crystal (CAAC) (e.g., InGaZnO), or combinations thereof.

14. The apparatus of claim 1 comprising a substrate, wherein (a) the first and second metal layers are each included in a backend portion of the apparatus, and (b) a frontend portion of the apparatus is located between a portion of the substrate and the backend portion.

15. The apparatus of claim 1 comprising:
   at least one of a processor and an application specific integrated circuit (ASIC);
   a memory cell that includes the TFT; and
   a single package including the memory cell and the at least one of the processor and the ASIC.

16. The apparatus of claim 15 comprising a die, wherein the memory cell and the at least one of the processor and the ASIC are both included on the die.

17. The apparatus of claim 1 wherein each of the first and second gate contacts are to couple to at least one power source to bias the first and second gate contacts independently of one another.

18. The apparatus of claim 1 wherein the first gate contact is to conduct read operations for the TNT but not write operations for the TNT.

19. A system comprising:
   a memory; and
   a processor coupled to the memory,
   wherein at least one of the processor and the memory include a TFT according to claim 1.

20. A method comprising:
   providing a thin film transistor (TFT) between first and second metal layers, the TFT comprising:
      source and drain contacts;
      first and second gate contacts;

a semiconductor material, comprising a channel, between the first and second gate contacts;

a charge trap layer between the first and second gate contacts, wherein the charged trap layer includes an insulator material with fixed charged particles;

simultaneously (a) applying a voltage to the second gate contact, but not the first gate contact, and at least one of the source and drain contacts to write a memory state to the TFT, and (b) applying a voltage to the first gate contact to read the memory state from the TFT.

21. The method of claim 20 comprising fixing the charged particles within a nitride included in the charge trap layer.

22. An apparatus comprising:
a thin film transistor (TFT) comprising:
source and drain contacts;
first and second gate contacts;
a semiconductor material, comprising a channel, between the first and second gate contacts;
a first dielectric layer, between the first and second gate contacts, to fix charged particles.

23. The apparatus of claim 22 wherein the first dielectric layer includes (a) an oxide, and (b) a nitride to fix the charged particles.

24. The apparatus of claim 22 comprising:
a second dielectric layer directly contacting a first surface of the first dielectric layer;
a third dielectric layer directly contacting a second surface of the first dielectric layer;
wherein the first and second surfaces are on opposing sides of the first dielectric layer.

25. The apparatus of claim 24 comprising:
an fourth dielectric layer between the channel and one of the first and second gate contacts;
wherein first dielectric layer is between the channel and another of the first and second gate contacts.

* * * * *